(12) United States Patent
Colli et al.

(10) Patent No.: US 8,785,996 B2
(45) Date of Patent: Jul. 22, 2014

(54) NANOWIRE FET

(75) Inventors: Alan Colli, Cambridgeshire (GB); Richard White, Huntingdon (GB)

(73) Assignee: Nokia Corporation, Espoo (FI)

( * ) Notice: Subject to any disclaimer, the term of this patent is extended or adjusted under 35 U.S.C. 154(b) by 346 days.

(21) Appl. No.: 12/856,129

(22) Filed: Aug. 13, 2010

(65) Prior Publication Data
US 2012/0038409 A1    Feb. 16, 2012

(51) Int. Cl.
| | |
|---|---|
| *H01L 27/108* | (2006.01) |
| *G06N 3/063* | (2006.01) |
| *G06N 3/067* | (2006.01) |
| *G06N 3/04* | (2006.01) |
| *H01L 31/113* | (2006.01) |

(52) U.S. Cl.
CPC ............. *H01L 31/113* (2013.01); *G06N 3/063* (2013.01); *G06N 3/067* (2013.01); *G06N 3/049* (2013.01)
USPC ............................ 257/296; 257/288; 257/306

(58) Field of Classification Search
USPC ............ 257/296, 288, 68, 306, 908; 977/701, 977/784, 963
See application file for complete search history.

(56) References Cited

U.S. PATENT DOCUMENTS

| | | | |
|---|---|---|---|
| 6,838,720 B2 * | 1/2005 | Krieger et al. ................. | 257/296 |
| 2010/0050745 A1 * | 3/2010 | Liu et al. ....................... | 73/31.06 |

OTHER PUBLICATIONS

Lee, et al, "Highly Scalable Non-Volatile and Ultra-Low Power Phase-Change Nanowire Memory", Nature Publishing Group. vol. 2, (Sep. 16, 2007), (pp. 626-630).
J. Borghetti, et al, "Optoelectronic Switch and Memory Devices Based on Polymer-Functionalized Carbon Nanotube Transistors", Adv. Mater. 18, (pp. 2535-2540), (2006).
Colli, et al, "Ion Beam Doping of Silicon Nanowires", Nano Letters. vol. 8, No. 8, (pp. 2188-2193), (2008).
Y. Li, et al, "Competitive Surface Effects of Oxygen and Water on UV Photoresponse ofZnO Nanowires", Applied Physics Letters 94, 023110, (3 pages), (2009).
K. Byon, et al, "Synthesis and Postgrowth Doping of Silicon Nanowires", Applied Physics Letters 87, 193104 (2005), (3 pages).
R. Ananthanarayanan, et al, "The Cat is Out of the Bag: Cortical Simulations with $10^9$ Neurons, $10^{13}$ Synapses", SC '09: Proceedings of the Conference on High Performance Computing Networking, Storage and Analysis 1 (2009)(12 pages).
Xiangfeng Duan, et al, "Nonvolatile Memory and Programmable Logic from Molecule-Gated Nanowires", Nano Letters. vol. 2, No. 5, (pp. 487-490), (2002).
Y. Dong, etal, "Si/a-Si Core/Shell Nanowires as Nonvolatile Crossbar Switches", Nano Letters. vol. 8., No. 2, (pp. 386-391), (2008).

(Continued)

*Primary Examiner* — Marc Armand
(74) *Attorney, Agent, or Firm* — Harrington & Smith

(57) ABSTRACT

An apparatus including a first electrode; a second electrode; a nano-scale channel between the first electrode and the second electrode wherein the nano-scale channel has a first state in which an electrical impedance of the nano-scale channel is relatively high and a second state in which the electrical impedance of the nano-scale channel is relatively low; dielectric adjacent the nano-scale channel; and a gate electrode adjacent the dielectric configured to control a threshold number of quanta of stimulus, wherein the nano-scale channel is configured to switch between the first state and the second state in response to an application of a quantum of stimulus above the threshold number of quanta of stimulus.

20 Claims, 5 Drawing Sheets

(56) References Cited

OTHER PUBLICATIONS

Figure 1:
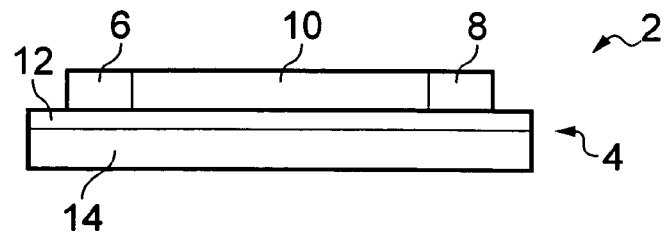

K. K. Likharev, "Hybrid CMOS/Nanoelectronic Circuits: Opportunities and Challenges", J. Nanoelect. Optoelect. vol. 3, No. 3., (pp. 203-230), (2008).

S. H. Jo, et al, "CMOS Compatible Nanoscale Nonvolatile Resistance Switching Memory", Nano Letters. vol. 8, No. 2, (pp. 392-397), (2008).

J. Zhou, et al, "Gigantic Enhancement in Response and Reset Time of ZnO UV Nanosensor by Uilizing Schottky Contact and Surface Functionalization", Applied Physics Letter 94, 191103, (3 pages), (2009).

W.M. Weber, et al, "Silicon-Nanowire Transistors with Intruded Nickel-Silicide Contacts", Nano Letters, vol. 0, No. 0, A-G, (2006).

Q. Lai, et al, "An Organic/Si Nanowire Hybrid Field Configurable Transistor", Nano Letters, vol. 8, No. 3, (pp. 876-880), (2008).

D. J. Sirbuly, et al, "Optical Routing and Sensing with Nanowire Assemblies", Proc. Nat. Acad. Sci. vol. 102, No. 22, (pp. 7800-7805), (2005).

* cited by examiner

NANOWIRE FET

BACKGROUND

Nanotechnology is a term that describes technology using structures that have a dimension of less than 1 micron.

Such small dimensions can produce novel effects. For example, quantization of electron energy levels may occur and result in novel electronic effects.

BRIEF SUMMARY

According to various, but not necessarily all, embodiments of the invention there is provided an apparatus comprising: a first electrode; a second electrode; a nano-scale channel between the first electrode and the second electrode wherein the nano-scale channel has a first state in which an electrical impedance of the nano-scale channel is relatively high and a second state in which the electrical impedance of the nano-scale channel is relatively low; dielectric adjacent the nano-scale channel; and a gate electrode adjacent the dielectric configured to control a threshold number of quanta of stimulus, wherein the nano-scale channel is configured to switch between the first state and the second state in response to an application of a quantum of stimulus above the threshold number of quanta of stimulus.

According to various, but not necessarily all, embodiments of the invention there is provided an integrated pulse integrator and pulse emitter for a light-base neural network comprising:
a field effect transistor comprising:
  a first electrode;
  a second electrode;
  a nano-scale channel between the first electrode and the second electrode wherein the nano-scale channel has a first state in which an electrical impedance of the nano-scale channel is relatively high and a second state in which the electrical impedance of the nano-scale channel is relatively low;
  dielectric adjacent the nano-scale channel; and
a gate electrode adjacent the dielectric configured to control a threshold,
wherein the nano-scale channel is configured to switch between the first state and the second state in response to an application of a light pulse in excess of the threshold, and wherein the gate electrode is configured to switch-back the nano-scale channel to the first state in response to a temporarily applied reset signal.

According to various, but not necessarily all, embodiments of the invention there is provided a light-based neural network comprising:
a plurality of neurons each of which comprises a field effect transistor comprising:
  a first electrode;
  a second electrode;
  a nano-scale channel between the first electrode and the second electrode wherein the nano-scale channel has a first high impedance state in which an electrical impedance of the nano-scale channel is relatively high and a second low impedance state in which the electrical impedance of the nano-scale channel is relatively low;
  dielectric adjacent the nano-scale channel; and
  a gate electrode adjacent the dielectric,
a plurality of light emitting devices, each of which is associated with a neuron;
a controller configured to control separately voltages applied to the gate electrodes of the plurality of neurons.

According to various, but not necessarily all, embodiments of the invention there is provided a method comprising:
using a controlled number of light pulses to switch a field effect transistor from a high impedance state to a low impedance state;
using the field effect transistor in the low impedance state to generate an output electric current; and
applying a voltage to a gate electrode of the field effect transistor to set the controlled number of light pulses.

According to various, but not necessarily all, embodiments of the invention there is provided an apparatus comprising: a field effect transistor comprising a nano-scale channel and a gate electrode configured to control a threshold, wherein the field effect transistor has a first state in which an electrical impedance of the nano-scale channel is relatively high and a second state in which the electrical impedance of the nano-scale channel is relatively low and wherein the field effect transistor is configured to switch between the first state and the second state in response to an application of stimulus above the threshold.

BRIEF DESCRIPTION

Figure 2:
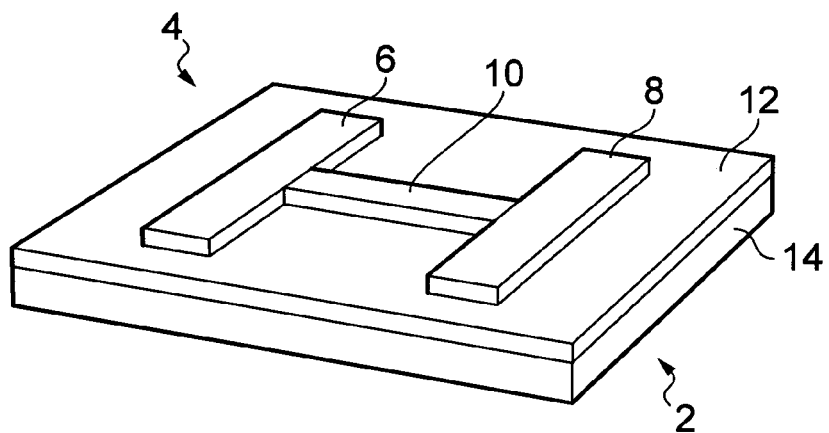
Figure 3:
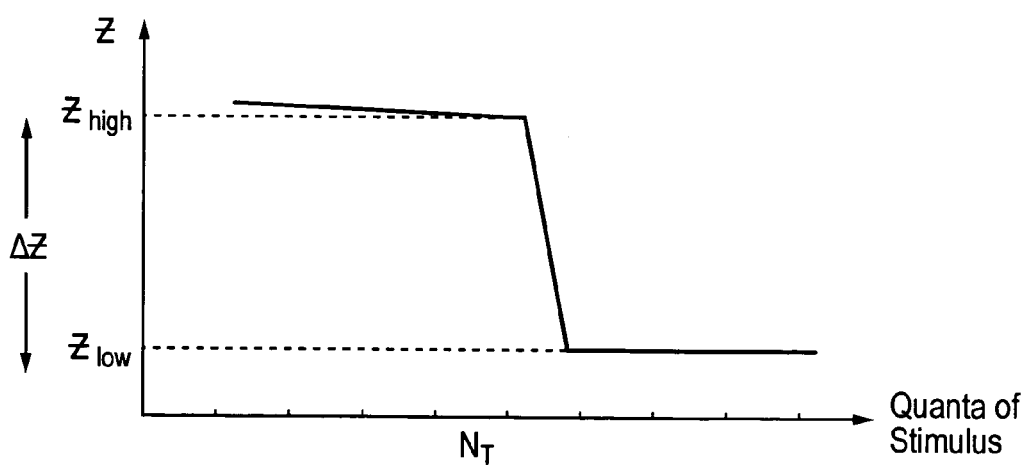
Figure 4:
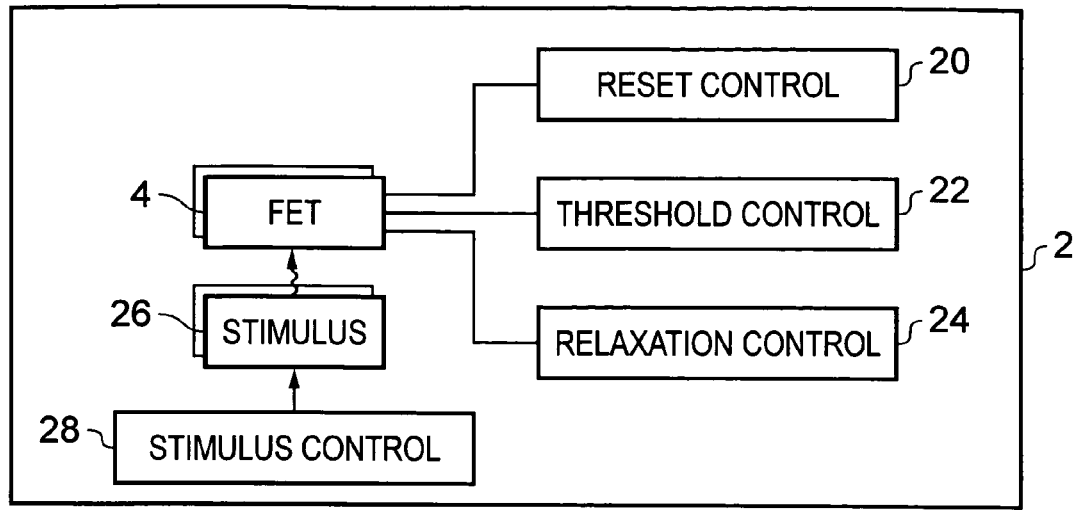
Figure 5:
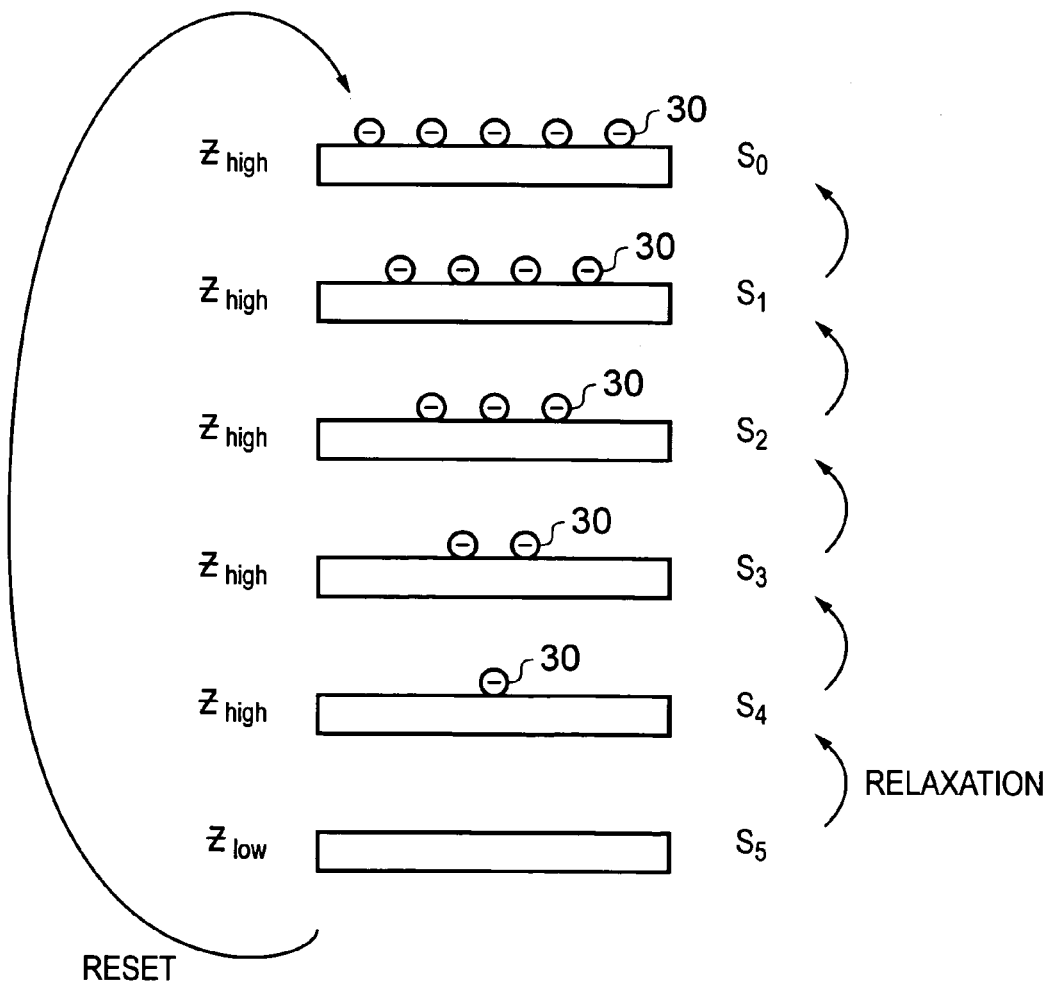
Figure 6:
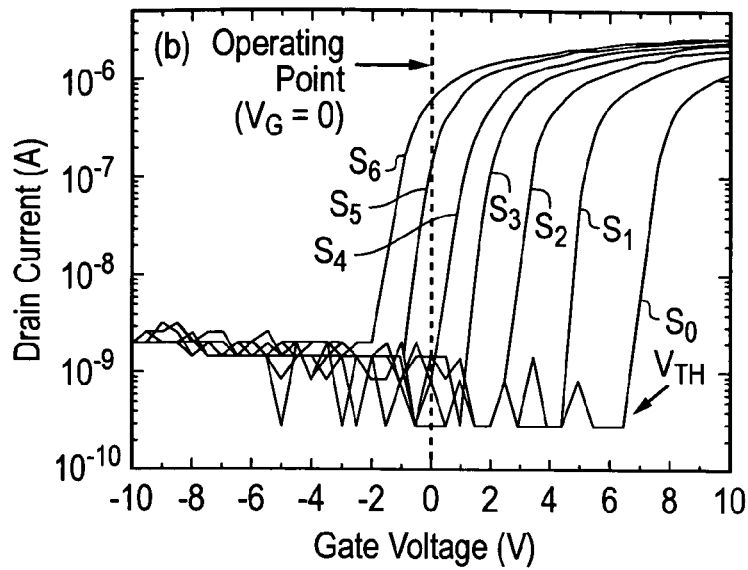
Figure 7:
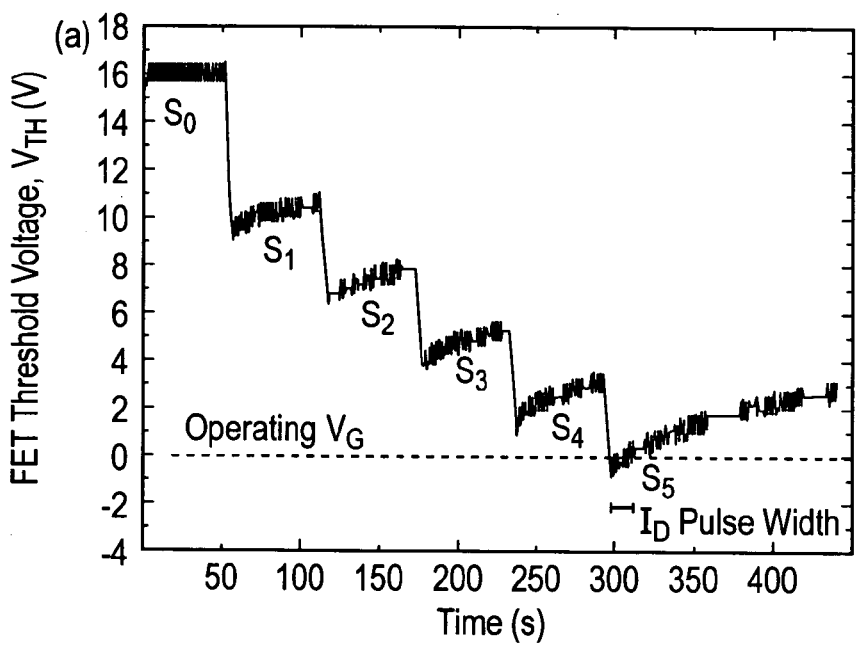
Figure 8:
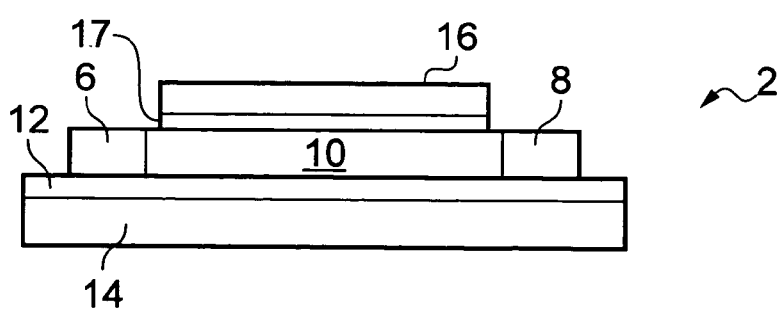
Figure 9:
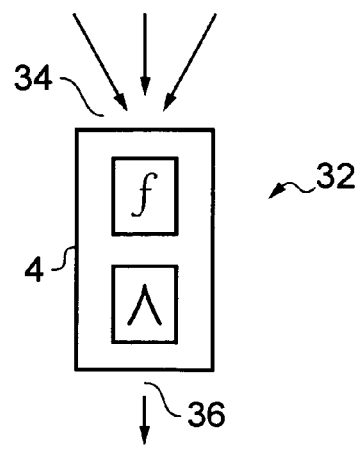
Figure 10:
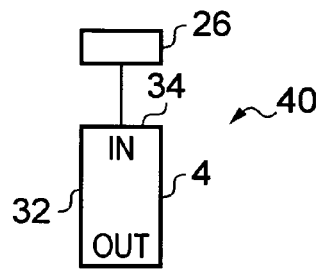
Figure 12:
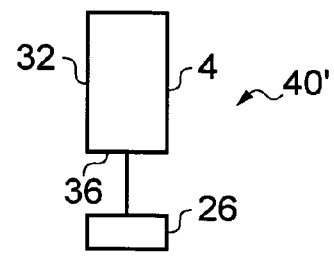
Figure 11:
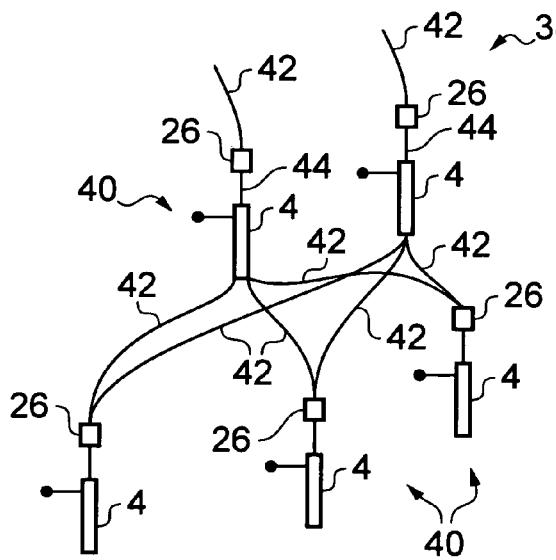
Figure 13:
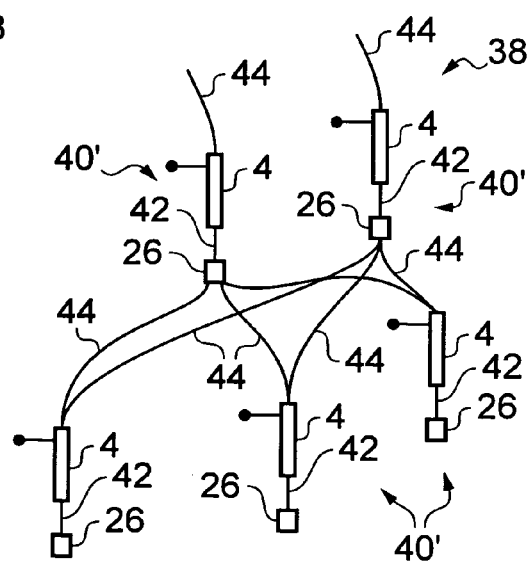
Figure 14:
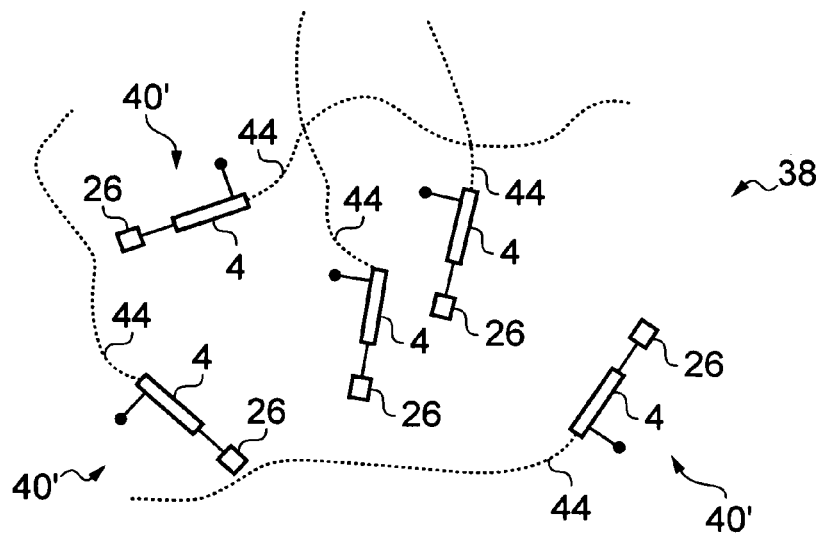
Figure 15:
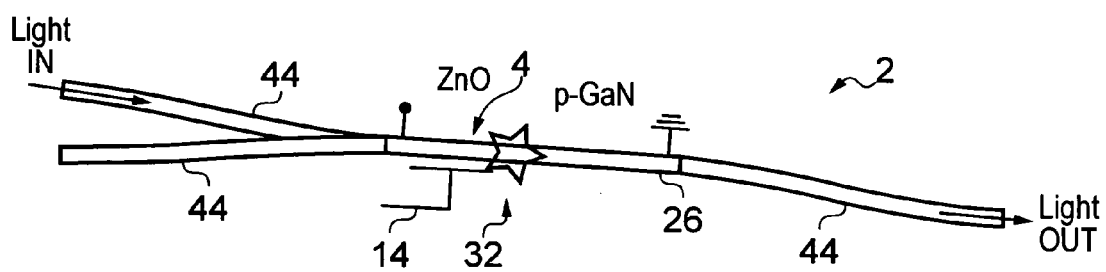
Figure 16:
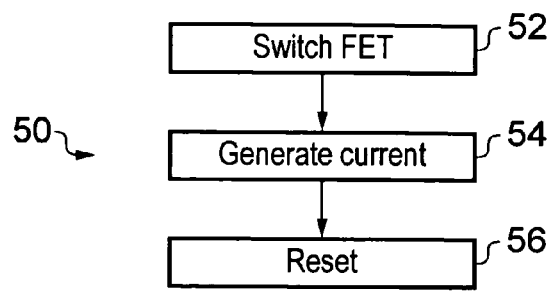

For a better understanding of various examples of embodiments of the present invention reference will now be made by way of example only to the accompanying drawings in which:

FIG. 1 schematically illustrates in cross-sectional view of an example of an apparatus;

FIG. 2 schematically illustrates in perspective view an example of an apparatus similar to that illustrated in FIG. 1;

FIG. 3 schematically illustrates a variation of an electrical impedance of a nano-scale channel with quanta of stimulus;

FIG. 4 schematically illustrates an apparatus that additionally comprises a stimulus source and various controllers;

FIG. 5 schematically illustrates how the application of successive quanta of stimulus changes the population of trapped charge at a field effect transistor by depopulation of the trapped charge region;

FIG. 6 schematically illustrates the transconductance response of the nano-scale channel in each of the states $S_0, S_1, S_2 \ldots S_5$;

FIG. 7 schematically illustrates an example of how the threshold gate voltage for an impedance transition changes with each quantum of stimulus;

FIG. 8 schematically illustrates an alternative implementation of the apparatus illustrated in FIG. 2;

FIG. 9 schematically illustrates a neuron of an artificial neural network;

FIG. 10 schematically illustrates a neural network unit in which the light emitting diode is associated with an input of a neuron;

FIG. 11 schematically illustrates a light-based neural network in which the output signal from a neuron is transported to the next neuron via electrical connections;

FIG. 12 schematically illustrates a neural network unit in which the light emitting diode is associated with an output of a neuron;

FIGS. 13 and 14 schematically illustrate light-based neural networks in which the output signal from a neuron is transported to the next neuron optically;

FIG. 15 schematically illustrates a network unit in which a neuron and a light emitting diode are integrated in an axial heterostructure; and FIG. 16 schematically illustrates a method.

DETAILED DESCRIPTION

FIG. 1 schematically illustrates an example of an apparatus 2 comprising: a first electrode 6; a second electrode 8; a nano-scale channel 10 between the first electrode 6 and the second electrode 8; dielectric 12 adjacent the nano-scale channel 10; and an electrode 14 adjacent the dielectric 12. The combination of first electrode 6, second electrode 8, nano-scale channel 10, dielectric 12 and the electrode 14 forms a field effect transistor 4 with the electrode 14 operating as a gate electrode of the field effect transistor (FET).

Referring to FIG. 3, the nano-scale channel 10 has a first high impedance state in which an electrical impedance Z of the nano-scale channel 10 has a relatively high value $Z_{high}$ and a second low impedance state in which the electrical impedance of the nano-scale channel 10 has a relatively low value $Z_{low}$.

The nano-scale channel 10 is configured to switch between the first high impedance state and the second low impedance state in response to an application of a quantum of stimulus above a threshold number (NT) of quanta of stimulus.

The relative electrical impedance change $\Delta Z_{NT}/Z_{NT}$ for the nano-scale channel 10 in response to the quantum of stimulus above the threshold is very much greater than a relative electrical impedance change $\Delta Z_{NT-1}/Z_{NT-1}$ for the nano-scale channel 10 in response to a preceding quantum of stimulus and is also very much greater than a relative electrical impedance change $\Delta Z_{NT+1}/Z_{NT+1}$ for the nano-scale channel 10 in response to a following quantum of stimulus, if any. Thus $(\Delta Z_{NT-1}/Z_{NT-1}) \ll (\Delta Z_{NT}/Z_{NT}) \gg (\Delta Z_{NT+1}/Z_{NT+1})$. $\Delta Z_{NT}/Z_{NT}$ may be 10 times, 100 times or more greater than $\Delta Z_{NT-1}/Z_{NT-1}$ and/or $\Delta Z_{NT+1}/Z_{NT+1}$. The relative electrical impedance change $\Delta Z_{NT}/Z_{NT}$ for the nano-scale channel 10 in response to the quantum of stimulus above the threshold is consequently a step change.

The gate electrode 14 is configured to switch-back the nano-scale channel 10 between the second low impedance state and the first high impedance state in response to a temporarily applied reset signal.

The nano-scale channel 10 may be formed from zinc oxide (ZnO). The nano-scale channel 10 may be formed from an elongate nanowire that extends lengthwise between the first electrode 6 and the second electrode 8. The width and/or height of the nano-scale channel may have a dimension less than 1 μm, for example, a width of the nano-scale channel 10 may be of the order 100 nm or less than 100 nm.

FIG. 8 schematically illustrates an alternative implementation of the apparatus 2 illustrated in FIG. 2. In this implementation, the nano-scale channel 10 has an additional second gate electrode 16 separated from the nano-scale channel 10 by a dielectric layer 17. The additional second gate electrode 16 opposes the first gate electrode 14 across the nano-scale channel 10.

One or both of the first gate electrode 14 and the second gate electrode 16 could be used to perform the reset function.

One or both of the first gate electrode 14 and the second gate electrode 16 could be used to perform the threshold control function.

FIG. 2 schematically illustrates an example of an apparatus 2 similar to that illustrated in FIG. 1. A field effect transistor 4 is formed using a bottom-up self-assembly process. A dielectric layer 12 overlies the conductive gate electrode layer 14. The first electrode 6, the second electrode 8 and the nano-scale channel 10 are formed on an upper surface of the dielectric layer 12.

In this example, the nano-scale channel 10 has a n-type conductivity. By temporarily applying a large reset positive voltage to the gate electrode 14, a population of trapped electrons is created. The application of a quantum of photo-stimulus to the trapped electrons reduces the number of trapped electrons.

The impedance state of the nano-scale channel 10 is dependent upon the population of trapped electrons. An application of a quantum of photo-stimulus above a threshold number of quanta of photo-stimulus, reduces the population of trapped electrons to a level where a non-linear transition in the impedance of the nano-scale channel from a high impedance state to a low impedance state occurs.

By temporarily applying a large positive reset voltage to the gate electrode 14, the population of trapped electrons is increased again. This forces the nano-scale channel 10 into the high impedance state again.

FIG. 5 schematically illustrates how the application of successive quanta of stimulus changes the population of trapped charge at the field effect transistor 4 by depopulation of the trapped charge region.

The Figure schematically illustrates a sequence $S_0$, $S_1$, $S_2 \ldots S_5$ of trapped charge states between a reset trapped charge state $S_0$ produced in response to an applied reset signal and a post-threshold trapped charge state $S_5$. The population 30 of trapped charges is different for each trapped charge state in the sequence $S_0, S_1, S_2 \ldots S_5$.

Each application of a quantum of stimulus changes a trapped charge state from a current trapped charge state $S_m$ in the sequence to a new adjacent trapped charge state $S_{m+1}$ in the sequence. The change in trapped charge state is a reversible change.

In the illustrated example, the post-threshold trapped charge state corresponds to the trapped charge state $S_5$ in the sequence obtained after a threshold number of quanta of stimulus has been applied.

Application of a quantum of stimulus above the threshold number of quanta of stimulus, results in a new post-threshold trapped charge state and results in the switching of the nano-scale channel 10 between the first high impedance state and the second low impedance state.

In the example illustrated in FIG. 5, a large positive voltage pulse is used as a reset signal. This reset signal creates a large population 30 of trapped electrons in the trapped charge state $S_0$. The application of a pulse of light (a quantum of stimulus) generates holes which combine with the trapped electrons reducing the population 30 of electrons and creating the next trapped charge state $S_1$. The application of another pulse of light (a quantum of stimulus) generates more holes which combine with the trapped electrons reducing the population 30 of electrons and creating the next trapped charge state $S_1$. Each application of a further pulse of light (quantum of stimulus) generates more holes which combine with the trapped electrons reducing the population 30 of electrons and creating the next trapped charge state. When the population 30 of electrons reduces below a critical value, which may be dependent upon the transverse electric field across the nano-scale channel 10, the impedance (transconductance) of the nano-scale channel 10 switches from a high impedance (low transconductance) state to a low impedance (high transconductance) state.

FIG. 6 schematically illustrates the transconductance response of the nano-scale channel 10 in each of the states $S_0$, $S_1, S_2 \ldots S_5$. Each response typically displays a step-change in impedance at a different threshold gate voltage value $V_{TH}$.

Assuming that the effective gate voltage is zero volts (i.e. the voltage of the gate electrode is at 0V or if a channel electrode 16 is used the potential difference between the channel electrode 16 and the gate electrode 14 is 0V) then each of the states $S_0, S_1, S_2 \ldots S_4$ has a high impedance. However, the state $S_5$ has a low impedance. Thus for an effective gate voltage of 0V the transition from a high impedance state to a low impedance state occurs in the transition between the trapped charge state $S_4$ and the trapped charge state $S_5$.

If one traces upwards, in FIG. 6, the dotted line representing the effective gate voltage of 0V, one can observe that the relative electrical impedance change for the nano-scale channel 10 at an effective gate voltage of 0V in response to the quantum of stimulus above the threshold ($5^{th}$ quantum) is one or two orders of magnitude greater than a relative electrical impedance change for the nano-scale channel 10 at an effective gate voltage of 0V in response to a preceding quantum of stimulus ($4^{th}$ quantum) and is one or two orders of magnitude greater than a relative electrical impedance change for the nano-scale channel 10 at an effective gate voltage of 0V in response to a following quantum of stimulus ($6^{th}$ quantum), if any.

Increasing the effective gate voltage will change where the transition from the high impedance state to the low impedance state occurs. Assuming that the effective gate voltage is increased to 3.5V then each of the states $S_0$ and $S_1$ has a high impedance. However, the state $S_2$ has a low impedance. Thus for an effective gate voltage of 3.5V the transition from a high impedance state to a low impedance state occurs in the transition between the trapped charge state $S_1$ and the trapped charge state $S_2$ i.e. in response to the second quantum of stimulus.

If one traces upwards in FIG. 6, an imaginary line representing the effective gate voltage of 3.5V, one can observe that the electrical impedance change for the nano-scale channel 10 at an effective gate voltage of 3.5 V in response to the quantum of stimulus above the threshold (2nd quantum) is one or two orders of magnitude greater than a relative electrical impedance change for the nano-scale channel 10 at an effective gate voltage of 3.5V in response to a preceding quantum of stimulus ($1st^h$ quantum) and is one or two orders of magnitude greater than a relative electrical impedance change for the nano-scale channel 10 at an effective gate voltage of 3.5V in response to a following quantum of stimulus (3rd quantum), if any.

It should be appreciated that the threshold where the transition between the high impedance state and the low impedance state occurs can be controlled by controlling the effective gate voltage, which is applied at least while each quantum of stimulus is applied and may be applied continuously.

FIG. 7 schematically illustrates the effect of relaxation on a trapped charge state. The trapped charged states may be lossy. That is, after a quantum of stimulus depopulates the population 30 of trapped charges, the population 30 may start to increase again.

FIG. 7 schematically illustrates an example of how the threshold gate voltage $V_{TH}$ for an impedance transition changes with each quantum of stimulus. The threshold gate voltage has a step decrease in value with each quantum of stimulus. When the threshold gate voltage reduces below the effective gate voltage then the impedance of the nano-scale channel 10 switches from the high impedance state to the low impedance state. In the illustrated example, when the threshold voltage drops beneath the effective gate voltage 0V in response to the fifth quanta of stimulus, the n-type nano-scale channel becomes conductive (see FIG. 6).

FIG. 7 additionally illustrates that although the threshold gate voltage has a step decrease in value with each quantum of stimulus, it also immediately starts to increase in value again (relaxation). When the increasing threshold gate voltage rises above the effective gate voltage then the impedance of the nano-scale channel 10 switches from the low impedance state to the high impedance state.

Consequently, the switch between the first high impedance state and the second low impedance state in response to an application of a quantum of stimulus above a threshold number of quanta of stimulus may be transitory and last only for a limited period dependent upon the rate at which relaxation occurs. The transitory change in impedance may be used to create a current pulse by applying a constant voltage between the first electrode 6 and the second electrode 8.

The duration of the transitory change in impedance may be controlled by for example controlling how far the application of a quantum of stimulus above a threshold number of quanta of stimulus brings the threshold gate voltage past the effective gate voltage and by controlling the rate of relaxation.

How far the application of a quantum of stimulus above a threshold number of quanta of stimulus brings the threshold gate voltage past the effective gate voltage may be controlled by for example controlling the intensity of a quantum of stimulus (e.g. controlling the intensity and/or duration of a light pulse) and by controlling for example the effective gate voltage.

The rate of relaxation may, for example, be controlled by controlling the thermodynamic equilibrium that results in the formation of trapped charges. For example, applying a larger effective gate voltage may increase the number of trapped charges. For example, increasing the temperature sufficiently may decrease the number of trapped charges. In some embodiments a chemical species, such as an atmospheric oxygen or water, may be involved in the formation of trapped charge states. Changing the oxygen or water concentration may change the relaxation rate.

The semiconductor material used to form the nano-scale channel 10 may be selected to have the following characteristics:

1) High absorption of the quanta of stimulus via electron-hole pair generation. If the quanta of stimulus are light pulses, this means that, for a practical and realistic technology, the semiconductor has a direct band gap. There are a large number of direct band gap semiconductors including, for example, direct band gap III-V semiconductors and direct band gap II-VI semiconductors. Some examples of direct band gap III-V semiconductors include GaSb, GaAs, GaN, InSb, InAs, InN, InP, AlGaAs, InGaAs, AlGaN. Some examples of direct band gap II-VI semiconductors include CdSe, CdS, ZnO, ZnSe, ZnS, ZnTe.

2) High mobility. The higher the mobility, the steeper the sub-threshold slope in FIG. 6. The higher the sub-threshold slope, the greater the electrical impedance change for the nano-scale channel 10 in response to the quantum of stimulus above the threshold The charge trapping mechanism may be engineered to have the following characteristics:

1) Stability or metastability of trapped charges in the absence of stimulus. The rate of relaxation should be sufficiently slow that the effect of each quantum of stimulus integrates. That is, the time constant for relaxation is significantly greater than the time period between quantum of stimulus (integration period).

2) Fast combination of minority carriers (holes) generated by a quantum of stimulus (e.g. a light pulse) with a population of trapped charges. The recombination time for trapped electrons is significantly shorter than the time period between quantum of stimulus (integration period).

3) Channel proximity. To successfully produce the gating effect required to modulate the channel impedance, the population of trapped charge must be at or very near the surface of the nano-scale channel 10.

4) Direct transport path between the area where generation of carriers occurs as a consequence of a quantum of stimulus and the area where charges are trapped. This can depend on the particular mechanism chosen for charge trapping:

In one embodiment, states trapping electrons (or holes) are embedded within the nano-scale channel 10 itself (e.g., crystallographic defects or surface states). Direct charge transfer is therefore straightforward.

In another embodiment, states trapping electrons (or holes) are created outside the nano-scale channel 10 using for example chemical adsorbates or polarisable coatings. In this case, to have direct charge transport to the traps from the nano-scale channel 10, no insulating barrier should be present at the interface between the nano-scale channel 10 and the population of trapped charges.

In order to achieve pulse emission, the charge trapping mechanism should possess the following characteristics:

1) Metastability. It should be possible to engineer the trapped charge lifetime to be of a similar scale to the time period between quantum of stimulus (integration period).

Zinc Oxide (ZnO) is one example of a material that has been used successfully as a nano-scale channel 10. ZnO efficiently absorbs ultraviolet (UV) light to produce electron-ole pairs, it has high electron and hole mobility. The charge trapping mechanism involves a chemical adsorbate (oxygen) at the ZnO surface and is metastable in the absence of light pulses. In the presence of light pulses, minority carriers (holes) recombine quickly with trapped electrons. The stability of the charge trapping mechanism may be engineered by, for example, controlling temperature and/or the relative concentration of adsorbates.

If charge trapping and relaxation mechanism is achieved via chemical adsorbates on the nanowire channel 10, then at least a portion of the nano-scale channel surface exposed to the environment, allowing adsorption. In the example of FIG. 1, exposure is straightforward. In the particular example of FIG. 8, if the nano-scale channel is completely covered by dielectric layer 17 and top gate 16, then the dielectric layer 17 and top gate 16 may have a nano-porous structure.

FIG. 4 schematically illustrates an apparatus 2 that additionally comprises a stimulus source 26 for providing quanta of stimulus and a stimulus controller 28 for controlling the stimulus source 26.

The stimulus source 26 may, for example, be a light source that is configured to provide light pulses as quanta of stimulus. The stimulus controller 28 is configured to control an intensity and/or a duration and/or a timing of the light pulses provided by the light source 26. The duration of a transitory change in impedance may be controlled by for example controlling the intensity of a quantum of stimulus (e.g. controlling the intensity and/or duration of a light pulse).

In one embodiment, the light source 26 is an ultra violet light emitting diode (LED). In other embodiments, the light source 26 may be a visible light LED. The light source 26 may be a separate component to the field effect transistor 4 or may be integrated as part of the field effect transistor 4.

The apparatus 2 may comprise more than one FET 4 and more than one stimulus source 26. A separate stimulus source may, for example, be associated with each FET 4.

The apparatus 2 schematically illustrated in FIG. 4 additionally comprises a reset controller 20. The reset controller 20 provides a voltage pulse to the gate electrode 14 of the FET 4. The reset controller 20 is configured to control the size and duration of the pulse and, in the example of FIG. 2, is thus able to control the population 30 of trapped electrons created on reset.

The apparatus 2 schematically illustrated in FIG. 4 additionally comprises a threshold controller 22. The threshold controller 20 controls how many quanta of stimulus are required to change the impedance state of the nano-scale channel 10. The threshold controller 22 in this example controls the effective gate voltage provided transversely to the nano-scale channel 10.

The apparatus 2 schematically illustrated in FIG. 4 additionally comprises a relaxation controller 24.

The relaxation controller 24 may, for example, control the effective gate voltage which affects how far the application of a quantum of stimulus above a threshold number of quanta of stimulus brings the threshold gate voltage past the effective gate voltage.

The relaxation controller 24 may, for example, control the rate of relaxation by controlling the thermodynamic equilibrium that results in the formation of trapped charges. For example, the relaxation controller 24 may apply an effective gate voltage to increase/decrease the number of trapped charges. For example, the relaxation controller 24 may control the local temperature of the nano-scale channel 10 or ambient temperature to increase/decrease the number of trapped charges.

The relaxation controller 24 typically controls the rate of relaxation so that the effect of each quantum of stimulus integrates. That is, the time constant for relaxation is significantly greater than the time period between quantum of stimulus.

The duration of a current pulse produced by the apparatus 2 when the number of applied quanta of stimulus exceeds the threshold number of quanta of stimulus may be controlled by controlling the rate of relaxation which controls the relaxation time constant.

As described above, the parameters that control when the number of applied quanta of stimulus exceeds the threshold number of quanta of stimulus include the characteristics of the stimulus (e.g. frequency, intensity, duration), the effective gate voltage and other parameters that affect the equilibrium of trapped electrons such as temperature and, in some cases, the presence of chemical species such as oxygen or water etc The above-described apparatus 2 may be used as a low-power sensor for a target one of these parameters. The apparatus 2 is configured so that a change in the target parameter beyond a threshold results in a change in the impedance state of the nano-scale channel 10. The apparatus 2 may consequently be configured as, for example, a humidity detector, an oxygen detector, a temperature detector, a light detector or a voltage detector.

The apparatus 2 may also be used as a timer. The timer may for example count a periodic number of stimulus or integrate a continuous stimulus until the impedance of the nano-scale channel changes indicating a timeout.

The apparatus 2 may also be used as pulse integrator in an artificial neuron of an artificial neural network (ANN).

FIG. 9 schematically illustrates a neuron 32. The neuron 32 has a single synapse (input) 34 which receives multiple different inputs. The inputs may, for example, be light pulses conveyed through a medium or channeled via a light guide. The inputs are combined without weighting at the input 34 of the neuron 32.

The neuron 32 comprises a pulse integrator with a variable threshold which counts the number of pulses received as inputs. When the threshold is exceeded, a pulse emitter is activated to produce an output current pulse from an output 36 of the neuron 32.

The field effect transistor 4 is configured to operate as the pulse integrator with a variable threshold. The field effect transistor can additionally be configured to also provide the function of the pulse emitter.

The field effect transistor 4 is configured so that the light pulses received as at the input 34 operate as the stimulus that changes the electrical impedance of the nano-scale channel 10.

The nano-scale channel 10 of the field-effect transistor 4 is configured to switch between the first high impedance state and the second low impedance state when the number of input light pulses exceeds a threshold number of light pulses. The threshold number may be controlled, as described above, by controlling the effective gate voltage of the FET 4.

The FET 4 may also be used as a pulse emitter in an artificial neuron of an artificial neural network (ANN).

The field-effect transistor is configured, as described with reference to FIGS. 4 and 7, to have a transitory change in the impedance of the nano-scale channel 10 from high impedance to low impedance. A constant voltage is applied between the first electrode 6 and the second electrode 8 of the FET 4 and the transitory step decrease in impedance produces a current pulse through the nano-scale channel 10 between electrodes 6, 8. This electric current pulse is produced as an output signal at an output 36 of the neuron 32.

The threshold at which the neuron fires can be controlled using a threshold controller 22 as described with reference to FIG. 4.

The duration of the current pulse may be controlled using the relaxation controller 24.

The intensity of the current pulse may be controlled by controlling the voltage applied between the first electrode 6 and the second electrode 8.

The FET 4 may therefore be used as a pulse integrator (with variable threshold) and as an integrated pulse integrator and pulse emitter in a neuron 32 of an ANN. The threshold for firing may be controlled. The firing is a step-change in output current which may be delivered as a pulse. The characteristics of the firing pulse may be controlled.

The input to the neuron 32 is light pulses and the output from the neuron 32 is electric current. To form a network 38 of neurons 32 it is therefore necessary to transduce the electric current to a light pulse. A light emitting diode 26 is a suitable transducer.

FIG. 10 schematically illustrates a neural network unit 40 in which the light emitting diode 26 is associated with the input of the neuron 32. As illustrated in FIG. 11, this neural network unit 40 results in a light-based neural network 38 in which the output signal from a neuron is transported to the next neuron via electrical connections 42 and the output of the light emitting diode is transported over a short distance, for example by a light guide 44, to the proximal associated neuron 32.

FIG. 12 schematically illustrates a neural network unit 40' in which the light emitting diode is associated with the output 36 of the neuron 32. As illustrated in FIGS. 13 and 14, this neural network unit 40' results in a light-based neural network 38 in which the output signal from a neuron is transported to the next neuron as light and the output of neuron 32 is transported over a short distance by an electrical connection 42 to the proximal associated light emitting diode 26.

In FIG. 13, the output signal from a neuron 32 (after being converted to light) is transported to the next neurons in the network 38 via light guides 44.

In FIG. 14, the output signal from a neuron 32 (after being converted to light) is transported to the next neurons in the network 38 as a 'broadcast' signal via an intervening medium without channeling by light guides. In the example of FIG. 14, the inputs to the neurons 32 have associated light guides for collecting the light propagating via the medium.

The neural network 38, as illustrated in FIG. 12, 13 or 14, may also be illustrated using, for example, FIG. 4. In FIG. 4, the FETs 4 correspond to the interconnected neurons 32.

Referring to FIG. 4, the neural network 38 comprises a reset controller 20 that resets the neurons 32 by controlling their gate voltages. The reset controller 20 may be configured to individually reset the neurons 32 or to collectively reset the neurons 32.

The neural network 38 comprises a threshold controller 22 that controls the threshold of each neuron 32 individually. The threshold controller 22 may be configured to control separately voltages applied to the gate electrodes 14 of the plurality of neurons 32. The 'learning' performed by the neural network 38 is achieved by controlling the thresholds of the individual neurons 32.

The neural network 38 may also comprise a relaxation controller 24. The relaxation controller 24 may, for example, control the ambient temperature of the neural network 38 or control the temperature of individual neurons 32 or groups of neurons 32.

The neural network 38 may also comprise a stimulus controller 28 configured to control characteristics such as duration of electric current pulses generated by the plurality of neurons 32.

FIG. 15 schematically illustrates a neural network unit 40' in which the neuron 32 and the light emitting diode 26 are integrated as an axial heterostructure. The axis of the heterostructure extends along a length of the nano-scale channel 10 of the field effect transistor 4 of the neuron 32. The field effect transistor 4 of the neuron 32 has a nano-scale channel 10 formed from zinc oxide that is integrated with a p-type gallium nitride light emitting diode.

FIG. 16 schematically illustrates a method 50 comprising: at block 52, using a controlled number of light pulses to switch a field effect transistor from a high impedance state to a low impedance state;

at block 54, using the field effect transistor in the low impedance state to generate an output electric current; and at block 56, applying a voltage to a gate electrode of the field effect transistor to reset the field effect transistor to the high impedance state.

Switching of the field effect transistor from a high impedance state to a low impedance state may only be temporary because of relaxation as described above.

The method 50 may also optionally comprise controlling a characteristic of the output electric current pulse.

The method 50 may also optionally comprise changing the controlled number of light pulses.

As used here 'module' or 'component' refers to a unit or apparatus that excludes certain parts/components that would be added by an end manufacturer or a user.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a first electrode;
   a second electrode;
   a nano-scale channel between the first electrode and the second electrode wherein the nano-scale channel has a first state in which an electrical impedance of the nano-scale channel is relatively high and a second state in which the electrical impedance of the nano-scale channel is relatively low;
   dielectric adjacent the nano-scale channel; and
   a gate electrode adjacent the dielectric configured to control a threshold number of quanta of photo-stimulus;
   wherein the nano-scale channel is configured to switch between the first state and the second state in response to an application of a quantum of photo-stimulus above the threshold number of quanta of photo-stimulus.

2. An apparatus as claimed in claim 1, wherein
   the electrical impedance change for the nano-scale channel in response to the quantum of stimulus above the threshold is at least ten times greater than an electrical impedance change for the nano-scale channel in response to a quantum of stimulus below the threshold; and
   the electrical impedance change for the nano-scale channel in response to a quantum of stimulus above the threshold is at least ten times greater than an electrical impedance change for the nano-scale channel in response to a quantum of stimulus subsequent to the quantum of stimulus above the threshold, if any.

3. An apparatus as claimed in claim 1, wherein the nano-scale channel is configured to switch from the first high impedance state associated with a larger population of trapped charges to the second low impedance state associated with a lower population of trapped charges in response to an application of a quantum of photo-stimulus above a threshold number of quanta of photo-stimulus, wherein the application of a quantum of photo-stimulus reduces the number of trapped charges.

4. An apparatus as claimed in claim 1, further comprising a threshold controller configured to adjust the threshold number of quanta of photo-stimulus and wherein the threshold controller is configured to adjust a voltage applied to the gate electrode.

5. An apparatus as claimed in claim 1, further comprising a relaxation controller configured to control relaxation of the nano-scale channel from the second low impedance state towards the first high impedance state.

6. An apparatus as claimed in claim 1, further comprising a reset controller configured to control the voltage temporarily applied to the gate electrode to force reset of the nano-scale channel to the first high impedance state.

7. An apparatus as claimed in claim 1, wherein the nano-scale channel is a nanowire.

8. A neural network component comprising the apparatus as claimed in claim 1.

9. An apparatus as claimed in claim 1 comprising a light source configured to provide light pulses as quanta of photo-stimulus.

10. An apparatus as claimed in claim 9, wherein the light source is configured to enable control of light pulse intensity and/or light pulse duration.

11. An apparatus as claimed in claim 10:
    wherein the nano-scale channel comprises a plurality of trapped charge states in sequence;
    wherein at least one of the trapped charge states is a pre-threshold trapped charge state, associated with the high impedance state and at least one of the trapped charge states is a post-threshold trapped charge state associated with the low impedance state;
    wherein the light source is configured to provide quanta of photo-stimulus configured to change a current trapped charge state to a next trapped charge state in the sequence.

12. An integrated pulse integrator and pulse emitter for a light-based neural network comprising:
    a field effect transistor comprising:
       a first electrode;
       a second electrode;
       a nano-scale channel between the first electrode and the second electrode;
          wherein the nano-scale channel has a first state in which an electrical impedance of the nano-scale channel is relatively high and a second state in which the electrical impedance of the nano-scale channel is relatively low;
       dielectric adjacent the nano-scale channel; and
       a gate electrode adjacent the dielectric configured to control a threshold; and
    wherein the nano-scale channel is configured to switch between the first state and the second state in response to an application quantum of photo-stimulus above a threshold number of quanta of photo-stimulus, and wherein the gate electrode is configured to switch-back the nano-scale channel to the first state in response to a temporarily applied reset signal.

13. An integrated pulse integrator and pulse emitter for a light-base neural network, as claimed in claim 12, further comprising a light emitting device, wherein the light emitting device comprises an integrated light emitting diode, and the light emitting diode is integrated as an axial heterostructure and an axis of the axial heterostructure extends along a length of the nano-scale channel.

14. An integrated pulse integrator and pulse emitter for a light-base neural network, as claimed in claim 12, wherein:
    the light emitting device provides an input for the integrated pulse integrator and pulse emitter, or
    the light emitting device provides an output for the integrated pulse integrator and pulse emitter.

15. A light-based neural network comprising:
    a plurality of neurons each of which comprises a field effect transistor comprising:
       a first electrode;
       a second electrode;
       a nano-scale channel between the first electrode and the second electrode
          wherein the nano-scale channel has a first high impedance state in which an electrical impedance of the nano-scale channel is relatively high and a second low impedance state in which the electrical impedance of the nano-scale channel is relatively low;
       dielectric adjacent the nano-scale channel; and a gate electrode adjacent the dielectric, configured to control a threshold number of quanta of photo-stimulus;

wherein the nano-scale is configured to switch between the first state and the second state in response to an application of a quantum of photo-stimulus above the threshold number of quanta of photo-stimulus, a plurality of light emitting devices, each of which is associated with a neuron; and a controller configured to control separately voltages applied to the gate electrodes of the plurality of neurons.

16. A light-based neural network as claimed in claim 15 wherein:

each of the plurality of light emitting devices provides an input to a neuron, or each of the plurality of light emitting devices provides an output from a neuron.

17. A light-based neural network as claimed in claim 15, wherein output from each of the plurality of light emitting devices is guided by light guides.

18. A light-based neural network as claimed in claim 15 wherein the output from a first neuron is provided to at least one further neuron.

19. A method comprising:

using a controlled number of quanta of photo-stimulus to switch a field effect transistor from a high impedance state to a low impedance state;

using the field effect transistor in the low impedance state to generate an output electric current; and applying a voltage to a gate electrode of the field effect transistor to control the threshold number of photo-stimulus required to switch the field effect transistor from the high impedance state to the low impedance state.

20. A method as claimed in claim 19 further comprising providing light pulses as quanta of photo-stimulus.

* * * * *